US009881655B2

(12) United States Patent
Katoch

(10) Patent No.: US 9,881,655 B2
(45) Date of Patent: *Jan. 30, 2018

(54) MEMORY CIRCUIT HAVING DATA LINES SELECTIVELY COUPLED TO A SENSE AMPLIFIER AND METHOD FOR OPERATING THE SAME

(71) Applicant: TAIWAN SEMICONDUCTOR MANUFACTURING COMPANY, LTD., Hsinchu (TW)

(72) Inventor: Atul Katoch, Kanata (CA)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/929,511

(22) Filed: Nov. 2, 2015

(65) Prior Publication Data

US 2016/0055887 A1 Feb. 25, 2016

Related U.S. Application Data

(63) Continuation of application No. 12/767,979, filed on Apr. 27, 2010, now Pat. No. 9,177,631.

(Continued)

(51) Int. Cl.
*G11C 11/409* (2006.01)
*G11C 7/06* (2006.01)
(Continued)

(52) U.S. Cl.
CPC .......... *G11C 7/062* (2013.01); *G11C 11/4076* (2013.01); *G11C 11/4091* (2013.01); *G11C 11/4094* (2013.01)

(58) Field of Classification Search
CPC . G11C 7/062; G11C 11/4076; G11C 11/4094; G11C 11/4091
See application file for complete search history.

(56) References Cited

U.S. PATENT DOCUMENTS 5,367,481 A 11/1994 Takase et al.
5,870,343 A 2/1999 Chi et al.
(Continued)

FOREIGN PATENT DOCUMENTS

JP 2002025268 A 1/2002
WO 2007110933 10/2007

OTHER PUBLICATIONS

English machine translation of JP2002025268A retrieved from PAJ on Jun. 14, 2012.

*Primary Examiner* — Khamdan Alrobaie
(74) *Attorney, Agent, or Firm* — Hauptman Ham, LLP

(57) ABSTRACT

A memory circuit includes a memory cell, a first bit line, a first bit line bar, a sense amplifier, a first switch and a second switch. The memory cell is coupled with a first bit line having a first bit line portion and a second bit line portion. The first bit line bar has a first bit line bar portion and a second bit line bar portion. The sense amplifier includes a read/write circuit configured to couple the second bit line portion to a global bit line. The first switch is coupled between the first bit line bar portion and the second bit line bar portion. The second switch is coupled between the first bit line portion and the second bit line portion.

20 Claims, 6 Drawing Sheets

Related U.S. Application Data

(60) Provisional application No. 61/244,744, filed on Sep. 22, 2009.

(51) Int. Cl.
  *G11C 11/4076*  (2006.01)
  *G11C 11/4091*  (2006.01)
  *G11C 11/4094*  (2006.01)

(56) References Cited

U.S. PATENT DOCUMENTS

| | | | |
|---|---|---|---|
| 5,953,275 A * | 9/1999 | Sugibayashi | G11C 7/065 365/189.02 |
| 6,249,476 B1 | 6/2001 | Yamazaki et al. | |
| 6,275,407 B1 | 8/2001 | Otsuka | |
| 6,292,417 B1 | 9/2001 | Seyyedy | |
| 7,760,567 B2 | 7/2010 | Kobayashi | |
| 2003/0021159 A1 | 1/2003 | Issa | |
| 2008/0025113 A1 | 1/2008 | Kitagawa | |
| 2008/0117698 A1 | 5/2008 | Hsu | |
| 2008/0225616 A1 * | 9/2008 | Cheng | G11C 11/406 365/203 |
| 2008/0291762 A1 * | 11/2008 | Kajigaya | G11C 11/4076 365/203 |
| 2008/0310243 A1 | 12/2008 | Jung et al. | |

* cited by examiner

US 9,881,655 B2

MEMORY CIRCUIT HAVING DATA LINES SELECTIVELY COUPLED TO A SENSE AMPLIFIER AND METHOD FOR OPERATING THE SAME

PRIORITY CLAIM

The present application is a continuation of U.S. application Ser. No. 12/767,979, filed Apr. 27, 2010, which claims priority of U.S. Provisional Application No. 61/244,744, filed Sep. 22, 2009, which are incorporated herein by reference in their entireties.

TECHNICAL FIELD

The present disclosure relates generally to the field of semiconductor circuits, and more particularly, to memory circuits and methods for accessing data stored in the memory circuits.

BACKGROUND

The semiconductor integrated circuit (IC) industry has experienced rapid growth. Technological advances in IC materials and design have produced generations of ICs where each generation has smaller and more complex circuits than the previous generation. The sizing down of the IC technique has been applied to memory circuit. Conventionally, memory circuits can include DRAM and SRAM circuits.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
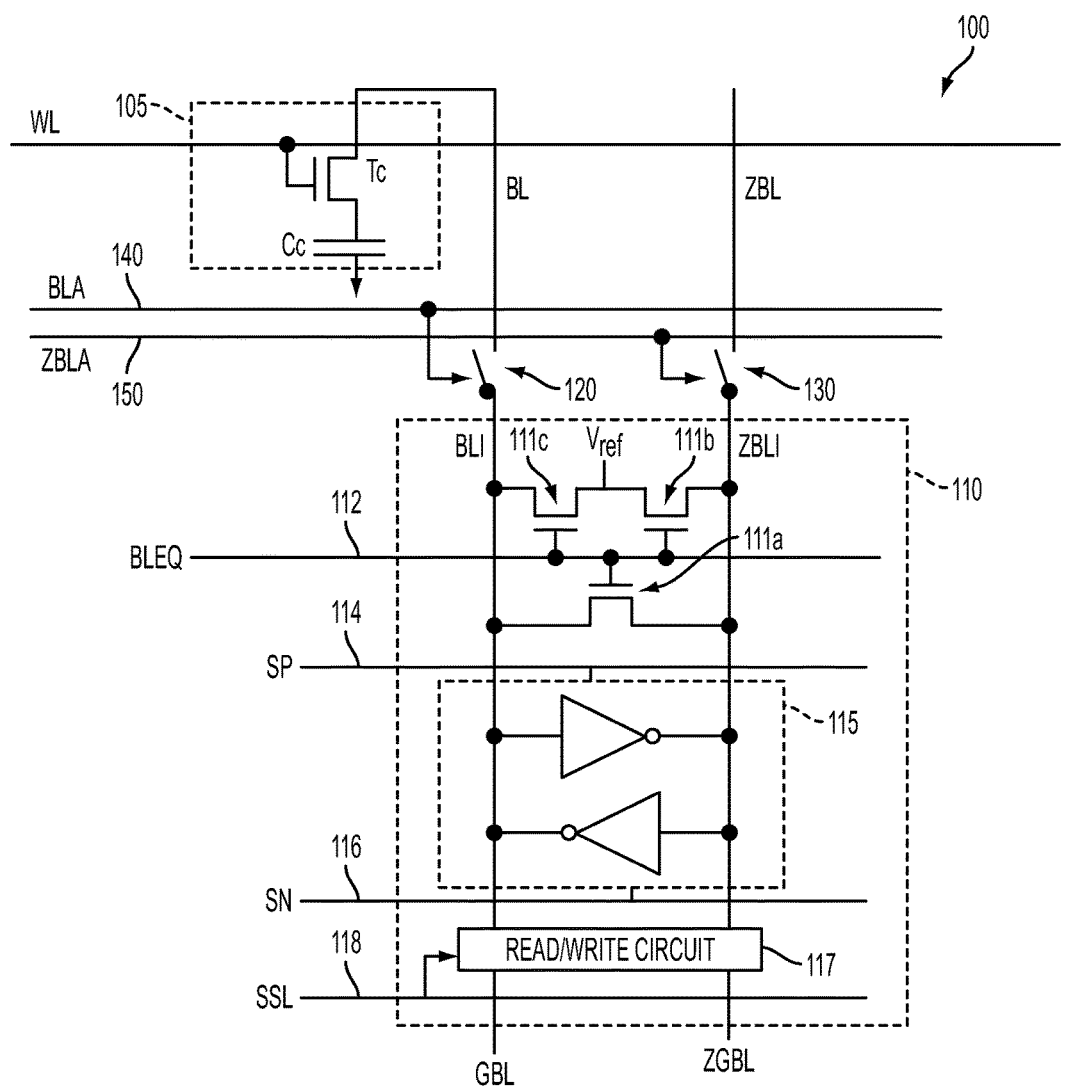
FIG. 1 is a schematic drawing illustrating an exemplary memory circuit.

A conventional embedded DRAM (eDRAM) circuit has a plurality of memory cells. For the conventional eDRAM circuit, capacitive storage memory cells of a memory array are provided. Each of the memory cells has an access transistor. Data stored in the memory cells is actually a charge stored on a small capacitor.

If the datum stored in one of the memory cells is to be output, the access transistor is activated by a word line (WL) coupled to the gate or control terminal of the access transistor. The activated access transistor can couple the capacitor to a bit line BL directly coupled to a sense amplifier. The bit line BL continuously extends between the sense amplifier and the memory array. The sense amplifier is also directly coupled to a bit line bar ZBL that continuously extends between the sense amplifier and the memory array. The sense amplifier senses a small voltage difference between the bit line pair BL and ZBL. After sensing the small voltage difference, the voltage state of the bit line BL is pulled down to VSS and the voltage state of the bit line bar ZBL is pulled up to VDD. The voltage swings of the bit line pair BL and ZBL toward VSS and VDD, respectively, further separate the voltage states of the bit line pair BL and ZBL. The datum "0" stored in the memory cell can thus be accessed.

After the separation of the voltage states of the bit line pair BL and ZBL, the voltage state of the bit line bar ZBL is kept at VDD. It is found that the voltage swing of the bit line bar ZBL toward VDD consumes a power. As noted, the memory array can have a plurality of bit line pairs, e.g., 2048 bit line pairs. The voltage swings of the bit lines ZBL of the 2048 bit line pairs consume more powers.

Based on the foregoing, memory circuits and methods for accessing the memory circuits are desired.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic drawing illustrating an exemplary memory circuit. In FIG. 1, a memory circuit 100 can include at least one memory cell, e.g., memory cell 105, disposed within a memory array (not shown). The memory cell 105 can be coupled with a word line WL and a bit line BL. A bit line bar ZBL can be disposed substantially parallel with the bit line BL. The memory circuit 100 can be a dynamic random access memory (DRAM) circuit, an embedded DRAM (eDRAM) circuit, a static random access memory (SRAM) circuit, an embedded SRAM circuit, a non-volatile memory, e.g., FLASH, EPROM, E²PROME, a field-programmable gate array circuit, a logic array circuit, and/or other memory circuit.

The memory circuit 100 can include a sense amplifier 110 and at least one switch, e.g., switches 120 and 130. The switch 130 can be coupled between the sense amplifier 110 and the bit line bar ZBL. The switch 120 can be coupled between the sense amplifier 110 and the bit line BL. In some embodiments, the switch 130 is capable of electrically isolating the sense amplifier 110 from the bit line bar ZBL if the sense amplifier 110 is capable of sensing a voltage difference $\Delta V_1$ between the bit line BL and the bit line bar ZBL. The voltage difference $\Delta V_1$ is substantially equal to or larger than a predetermined value. In some embodiments, the bit line pair BL and ZBL are free from continuously extending between the memory array including the memory cell 105 and the sense amplifier 110.

For some embodiments using a DRAM cell, the memory cell 105 can include a memory transistor $T_c$ and a capacitor $C_c$. The capacitor $C_c$ is capable of storing a charge representative of a datum, e.g., "0" or "1". It is noted that though only one memory cell 105 is depicted, other cells (not shown) can be placed at intersections of a plurality of word lines and bit lines. In some embodiments, the memory array including the memory cell 105 may have 8, 16, 32, 64, 128 or more columns that can be arranged in word widths. In some embodiments, the word lines can be laid out substantially orthogonally to the bit lines. In other embodiments, other arrangements of the word lines and bit lines can be provided.

Referring to FIG. 1, the sense amplifier 110 can include at least one bit line equalization transistor, e.g., bit line equalization transistors 111a-111c. The bit line equalization transistors 111a-111c can be coupled between a bit line pair BLI and ZBLI. A node between the bit line equalization transistors 111b and 111c can be coupled with a reference voltage $V_{ref}$. In some embodiments, the reference voltage $V_{ref}$ can be referred to as a bit line reference voltage. The reference voltage $V_{ref}$ can be substantially equal to, for example, ½ VDD, VDD, VSS, or other desired voltage. Gates of the bit line equalization transistors 111a-111c can be coupled with a signal line 112 that can receive a bit line equalization (BLEQ) signal. In some embodiments, when precharging the bit line pair BLI and ZBL1, the bit line equalization signal BLEQ can turn on the bit line equalization transistors 111a-111c. It is noted that the type and number of the bit line equalization transistors 111a-111c described above is merely exemplary. The scope of the invention is not limited thereto.

Referring to FIG. 1, the sense amplifier 110 can include a sensing pair 115. In some embodiments, the sensing pair 115 can include, for example, two cross-coupled inverters. The cross-coupled inverters can be disposed between the bit line pair BLI and ZBLI. In some embodiments, the cross-coupled inverters can be coupled with signal lines 114 and 116 that can receive enable signals SP and SN, respectively. In some embodiments, the enable signals SP and SN can enable the sensing pair 115 for sensing a voltage difference between the bit line pair BLI and ZBLI.

Referring to FIG. 1, the sense amplifier 110 can include a read/write circuit 117. The read/write circuit 117 can be coupled between the bit line pair BLI and ZBLI and a global bit line pair GBL and ZGBL. In some embodiments, the read/write circuit 117 can include at least one read column select transistor and at least one write column select transistor (not shown). The read/write circuit 117 can be coupled with at least one select signal line, e.g., select signal line 118, which is capable of receiving a column select signal SSL, e.g., a read column select signal RSSL or a write column select signal WSSL. The column select signal SSL can control the read/write select 117 to couple the bit line pairs BLI and ZBLI with the global bit line pairs GBL and ZGBL for read or write.

Referring again to FIG. 1, the memory circuit 100 can include signal lines 140 and 150 that can receive control signals BLA and ZBLA, respectively. The control signals BLA and ZBLA can control on or off of the switches 120 and 130, respectively. In some embodiments, each of the switches 120 and 130 can include a MOS transistor, a pass-gate, a bipolar transistor, other switch, or any combinations thereof.

In some embodiments, the memory circuit 100 can include at least one control circuit (not shown). The control circuit can control the word line signal, the bit line signal, the bit line equalization signal BLEQ, the enable signals SP, SN, the column select signal SSL, and/or the control signals BLA, ZBLA.

Figure 2:
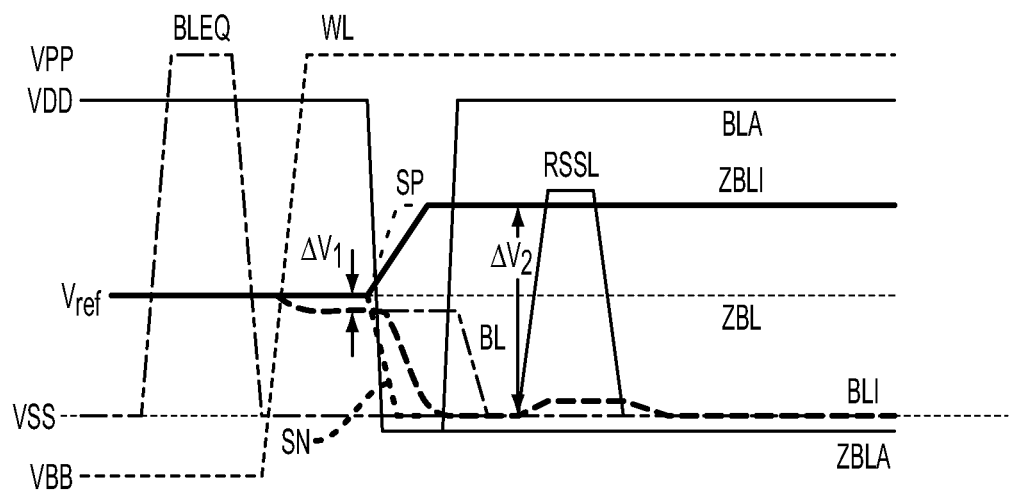
FIG. 2 is a schematic drawing illustrating waveforms of various signals applied to an exemplary memory circuit for reading the datum stored within the memory cell.

Following is a description regarding an exemplary method for accessing the datum stored within the memory cell 105. FIG. 2 is a schematic drawing illustrating waveforms of various signals applied to the memory circuit 100 for reading the datum stored within the memory cell 105.

Referring to FIGS. 1 and 2, during a precharge period the switches 120 and 130 can be closed to couple the bit line pair BL and ZBL with the bit line pair BLI and ZBLI, respectively. The bit line equalization signal BLEQ applied to the signal line 112 can transition from low, e.g., VSS, to high, e.g., VPP, turning on the bit line equalization transistors 111a-111c. The turned-on bit line equalization transistors 111a-111c can couple the bit line pairs BL, ZBL, BLI, and ZBLI with the reference voltage $V_{ref}$, e.g., ½ VDD. In some embodiments, the signal lines 114 and 116 can be precharged to a voltage state that can be substantially equal to the reference voltage $V_{ref}$.

When bit line equalization signal BLEQ is going low, a charge sharing between the capacitor $C_c$ with the bit line BL can follow. For example, the word line WL can transition from low, e.g., VBB, to high, e.g., VPP. The high voltage state VPP of the word line WL can turn on the memory transistor $T_c$. The turned-on memory transistor $T_c$ can couple the capacitor $C_c$ with the bit line BL. As noted, the bit line pair BL and ZBL is coupled with the bit line pair BLI and ZBLI, respectively. The charge stored within the capacitor $C_c$ can be charge shared with the bit lines BL and BLI. In some embodiments reading a datum "0" stored in the memory cell 105, the voltage state of the bit lines BL and BLI is pulled down such that the voltage difference $\Delta V_1$ occurs between the bit line pair BL and ZBL and between the bit line pair BLI and ZBLI.

The voltage difference $\Delta V_1$ on the bit line pair BLI and ZBLI can be further separated for sensing. As noted, if the voltage difference $\Delta V_1$ is substantially equal to or larger than a predetermined value, the switches 120 and 130 can electrically isolate the sense amplifier 110 from the bit line pair BL and ZBL, respectively. For example, the control signals BLA and ZBLA can open the switches 120 and 130, respectively, to electrically isolate the sense amplifier 110 from the bit line pair BL and ZBL, respectively. The bit line BL and bit line bar ZBL are thus floating. In some embodiments, the voltage difference $\Delta V_1$ can include an offset of the sensing pair 115 of the sense amplifier 110. The offset of the sensing pair 115 can include, for example, a threshold voltage difference of transistors of the sensing pair 115, a dimension variation of the transistors of the sensing pair 115, other offset of the sensing pairs 115, or any combinations thereof. In other embodiments using 40-nm technology, the voltage difference $\Delta V_1$ can be between about 50 mV and about 70 mV. It is noted that the voltage difference $\Delta V_1$ described above is merely exemplary. The scope of the invention is not limited thereto.

After being electrically isolated from the bit line pair BL and ZBL, the bit line pair BLI and ZBLI can have the voltage difference $\Delta V_1$. The enable signal SP can pull the voltage state of the signal line 114 from $V_{ref}$ toward, e.g., VDD, and the enable signal SN can pull the voltage state of the signal line 116 from $V_{ref}$ toward, e.g., VSS. The voltage swings of the enable signals SP and SN can enable the sensing pair 115 to sense the voltage difference $\Delta V_1$. The voltage states of the bit line pair BLI and ZBLI can be further separated to a voltage difference $\Delta V_2$.

A global sense circuit (not shown) can sense the voltage difference $\Delta V_2$ between the bit line pair BLI and ZBLI for outputting the datum "0" stored in the memory cell 105. For example, a read column select signal RSSL can transition from low, e.g., VSS, toward high, e.g., VDD, turning on the read column select transistor of the read/write select 117. The turned-on read column select transistor can couple the bit line pair BLI and ZBLI with the global bit line pair GBL and ZGBL, respectively. The global sense circuit (not shown) coupled with the global bit line pair GBL and ZGBL can sense the voltage difference $\Delta V_2$ between the bit line pair BLI and ZBLI. The datum "0" stored in the memory cell 105 can be accessed and/or output. After the datum "0" is accessed, the switch 120 can be closed to electrically couple the sense amplifier 110 with the bit line BL to restore/write the memory cell.

Figure 3:
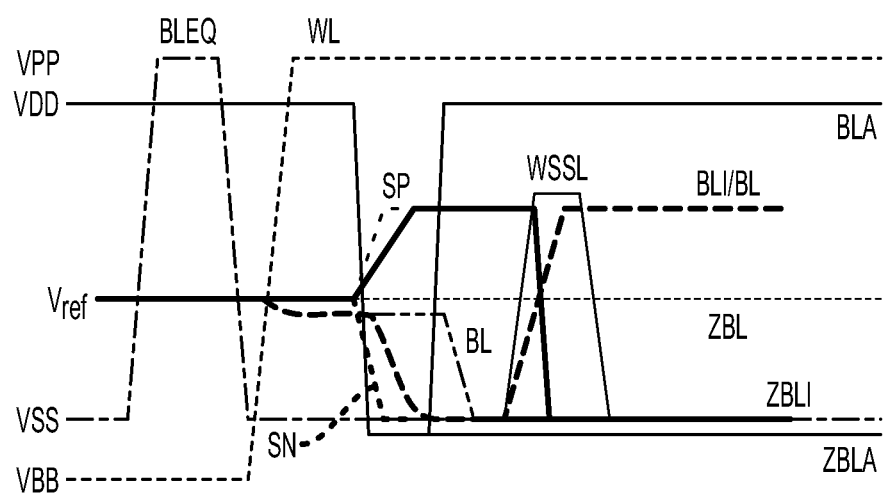
FIG. 3 is a schematic drawing illustrating waveforms of various signals applied to an exemplary memory circuit for restoring the datum "0" to the memory cell.

Following is a description regarding an exemplary method for restoring the datum to the memory cell 105. FIG. 3 is a schematic drawing illustrating waveforms of various signals applied to the memory circuit 100 for restoring the datum "0" to the memory cell 105.

From the precharge period to the voltage difference $\Delta V_2$ of the bit line pair BLI and ZBLI, the operation of the signals BLEQ, WL, SN, SP, BL, ZBL, BLI, ZBLI, BLA, and ZBLA in FIG. 3 can be similar to those described above in conjunction with FIG. 2. For embodiments restoring the datum "0" to the memory cell 105, the switch 120 can be closed, coupling the bit line BL with the bit line BLI. Since the bit line BLI has a low voltage state, e.g., VSS, the voltage state of the bit line BL is pulled down.

After the pull-down of the voltage state of the bit line BL, a write column select signal WSSL can transition from low, e.g., VSS, toward high, e.g., VDD, turning on the write column select transistor within the read/write circuit 117. The turned-on write column select transistor can couple the bit line pair BLI and ZBLI with the global bit line pair GBL and ZGBL, respectively. The global sense circuit (not shown) coupled with the global bit line pair GBL and ZGBL can drive up the voltage state of the bit lines BL and BLI and drive down the voltage state of the bit line bar ZBLI. Since the bit line bar ZBLI is electrically isolated from the bit line bar ZBL, the bit line bar ZBL is floating.

It is noted that the description described above regarding the operation and waveforms of the memory circuit 100 is merely exemplary. It is also noted that the voltage states, VPP, VDD, VSS, and/or VBB are merely exemplary. One of skilled in the art can modify them to desirably operate the memory circuit 100.

Figure 4:
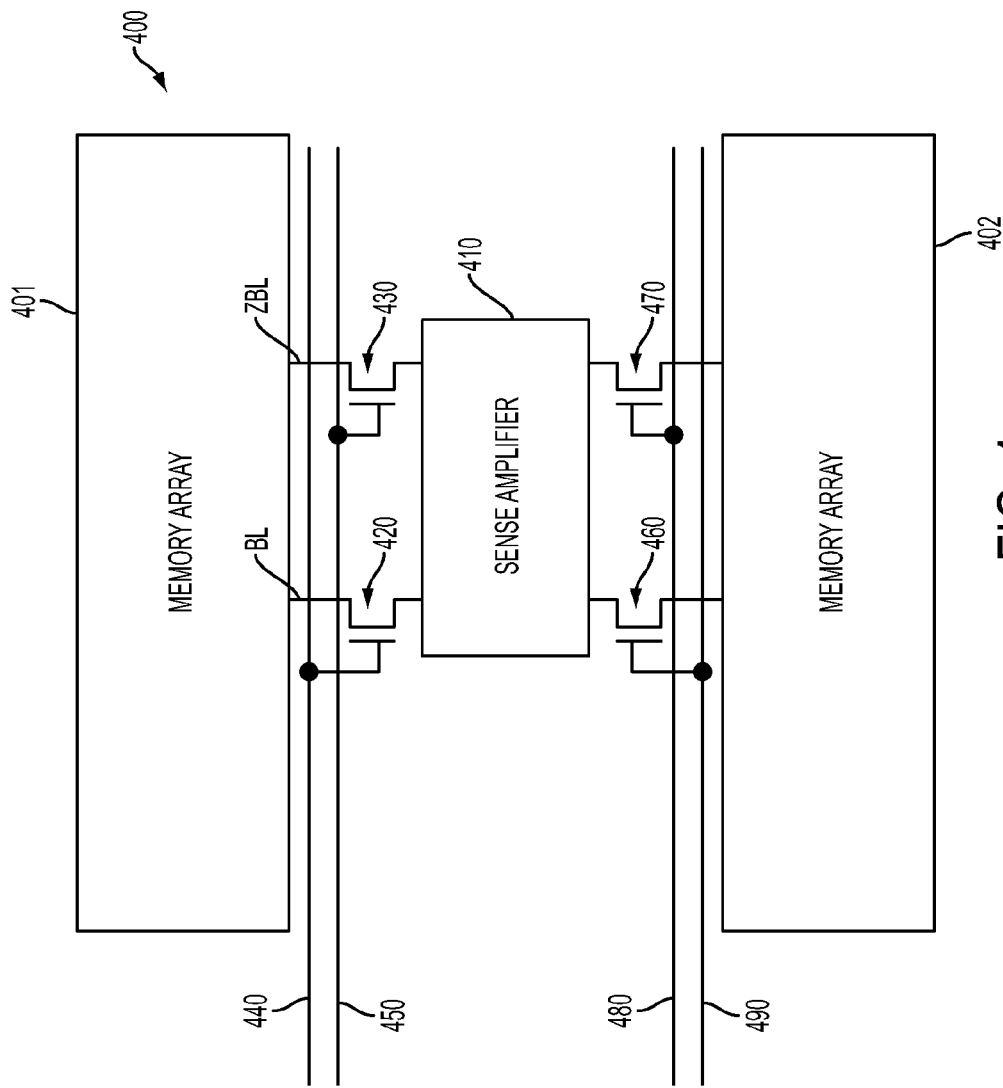
FIG. 4 is a schematic drawing illustrating another exemplary memory circuit including a sense amplifier coupled between two memory arrays.

FIG. 4 is a schematic drawing illustrating another exemplary memory circuit including a sense amplifier coupled between two memory arrays. Items of FIG. 4 that are the same items in FIG. 1 are indicated by the same reference numerals, increased by 300. In FIG. 4, each of the memory arrays 401 and 402 can be similar to the memory array including the memory cell 105 described above in conjunction with FIG. 1. Signal lines 480 and 490 can be similar to the signal lines 420 and 430, respectively.

Referring to FIG. 4, a sense amplifier 410 can be disposed between the memory arrays 401 and 402. Switches 420 and 430, e.g., MOS transistors, can be coupled between the memory array 401 and the sense amplifier 410. Switches 460 and 470, e.g., MOS transistors, can be coupled between the memory array 402 and the sense amplifier 410. As noted, the memory arrays 401 and 402 can share the same sense amplifier 410. The area of the memory circuit 400 can be desirably achieved.

Figure 5:
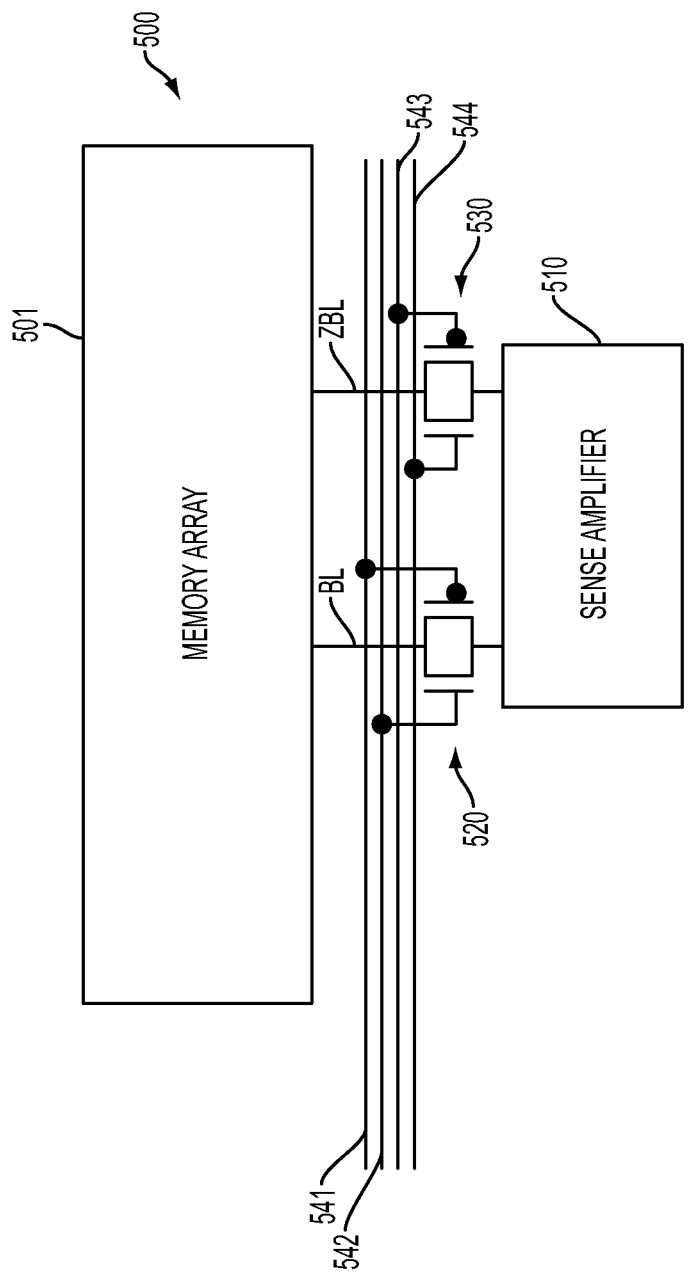
FIG. 5 is a schematic drawing illustrating an exemplary memory circuit including a sense amplifier coupled with a memory array.

FIG. 5 is a schematic drawing illustrating an exemplary memory circuit including a sense amplifier coupled with a memory array. Items of FIG. 5 that are the same items in FIG. 1 are indicated by the same reference numerals, increased by 400. In FIG. 5, the memory array 501 can be similar to the memory array including the memory cell 105 described above in conjunction with FIG. 1. Switches 520 and 530 can be, for example, pass gates. Each of signal lines 541-544 can be coupled with one of the switches 520 and 530. The signal lines 541-544 can receive control signals for coupling or electrically isolating the memory array 501 with the sense amplifier 510. It is noted that another memory array (not shown) and pass-gate switches can be coupled on the other side of the sense amplifier 510 as described above in conjunction with FIG. 4.

Figure 6:
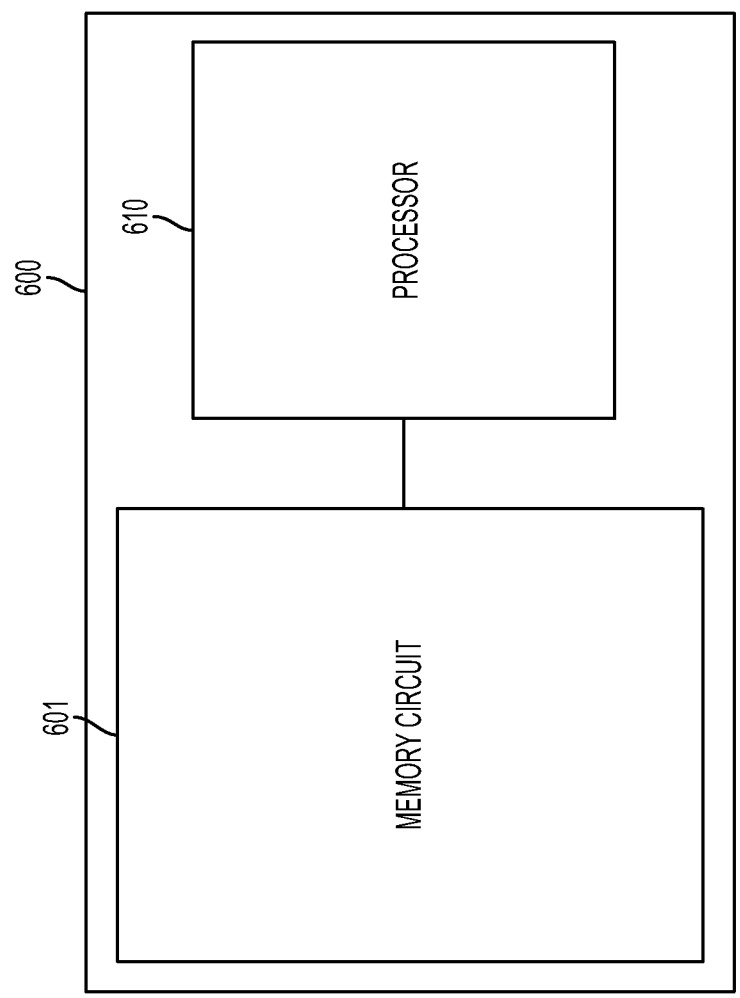
FIG. 6 is a schematic drawing showing a system including an exemplary memory circuit.

FIG. 6 is a schematic drawing showing a system including an exemplary memory circuit. In FIG. 6, a system 600 can include a processor 610 coupled with the memory circuit 601. The memory circuit 601 can be similar to the memory circuit 100, 400, or 500 described above in conjunction with FIGS. 1, 4, and 5.

The processor 610 is capable of accessing the datum stored in a memory cell of the memory circuit 601. In some embodiments, the processor 610 can be a processing unit, central processing unit, digital signal processor, or other processor that is suitable for accessing data of memory circuit.

In some embodiments, the processor 610 and the memory circuit 601 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 600 including the memory circuit 601 can provides an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

One aspect of this description relates to a memory circuit comprising a memory cell coupled with a first bit line having a first bit line portion and a second bit line portion. The memory circuit further includes a first bit line bar, a sense amplifier, a first switch and a second switch. The first bit line bar has a first bit line bar portion and a second bit line bar portion. The sense amplifier comprises a read/write circuit being configured to couple the second bit line portion to a global bit line. The first switch is coupled between the first bit line bar portion and the second bit line bar portion. The first switch is configured to electrically isolate the sense amplifier from the first bit line bar portion after a first time interval, where a first voltage difference between the second bit line portion and the second bit line bar portion is substantially equal to or larger than a predetermined value. The second switch is coupled between the first bit line portion and the second bit line portion. The second switch is configured to (1) electrically isolate the sense amplifier from the first bit line portion based on a received signal during the first time interval, and to (2) electrically couple the first bit line portion and the sense amplifier during a second time interval, where the read/write circuit is operated to couple the second bit line portion and the global bit line.

Another aspect of this description relates to a memory circuit comprising a memory cell coupled with a first bit line having a first bit line portion and a second bit line portion. The memory circuit further includes a first bit line bar, a sense amplifier, a first switch and a second switch. The first bit line bar has a first bit line bar portion and a second bit line bar portion. The sense amplifier comprises a read/write circuit being configured to couple the second bit line portion to a global bit line. The first switch is coupled between the first bit line bar portion and the second bit line bar portion. The first switch is configured to (1) electrically isolate the first bit line bar portion and the sense amplifier based on a first received signal during a first time interval, where a first voltage difference between the second bit line portion and the second bit line bar portion is substantially equal to or larger than a predetermined value, and to (2) electrically isolate the first bit line bar portion from the sense amplifier during a second time interval, where the read/write circuit is configured to couple the second bit line portion and the global bit line. The second switch is coupled between the first bit line portion and the second bit line portion. The second switch is configured to electrically couple the first bit line portion and the sense amplifier based on a second received signal during the second time interval.

Still another aspect of this description relates to a method for accessing a datum stored within a memory cell. The method comprising operating a sense amplifier to sense a first voltage difference between a bit line and a bit line bar, the bit line being coupled to the memory cell, the bit line having a first bit line portion and a second bit line portion, and the bit line bar having a first bit line bar portion and a second bit line bar portion. The method further includes electrically isolating the first bit line bar portion from the sense amplifier after the first voltage difference is equal to or greater than a predetermined value. The method further includes electrically isolating the first bit line portion from the sense amplifier after the first voltage difference is equal to or greater than a predetermined value. The method further includes electrically isolating the first bit line bar portion from the sense amplifier after receiving a select signal. The method further includes coupling the first bit line portion and the sense amplifier after receiving the select signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
    a memory cell coupled with a first bit line having a first bit line portion and a second bit line portion;
    a first bit line bar having a first bit line bar portion and a second bit line bar portion;
    a sense amplifier comprising a read/write circuit being configured to couple the second bit line portion to a global bit line;
    a first switch coupled between the first bit line bar portion and the second bit line bar portion, the first switch being configured to electrically isolate the sense amplifier from the first bit line bar portion after a first time interval, where a first voltage difference between the second bit line portion and the second bit line bar portion is substantially equal to or larger than a predetermined value; and
    a second switch coupled between the first bit line portion and the second bit line portion, the second switch being configured to (1) electrically isolate the sense amplifier from the first bit line portion based on a received signal during the first time interval, and to (2) electrically couple the first bit line portion and the sense amplifier during a period when the read/write circuit is operated to couple the second bit line portion and the global bit line, wherein
        the first switch is configured to electrically isolate the sense amplifier from the first bit line bar portion during a period of time when the first bit line portion is electrically coupled to the sense amplifier.

2. The memory circuit of claim 1, wherein the sense amplifier is further configured to sense the first voltage difference between the second bit line portion and the second bit line bar portion after the sense amplifier is electrically isolated from the first bit line bar portion.

3. The memory circuit of claim 1, wherein the sense amplifier comprises a pair of cross-coupled inverters.

4. The memory circuit of claim 1, wherein the first switch or the second switch comprises a MOS transistor, a pass gate, a bipolar transistor, or combinations thereof.

5. The memory circuit of claim 1, wherein the sense amplifier comprises a transistor pair coupled with a reference voltage supply, the transistor pair being coupled between the first memory cell and the read/write circuit.

6. The memory circuit of claim 1, wherein the sense amplifier comprises an equalization circuit configured to couple the first bit line and the second bit line with a reference voltage supply.

7. The memory circuit of claim 6, wherein the equalization circuit comprises:
    a first transistor having a first terminal coupled to a signal line, a second terminal coupled to the reference voltage supply, and a third terminal coupled to the second bit line portion; and
    a second transistor having a first terminal coupled to the signal line, a second terminal coupled to the reference voltage supply, and a third terminal coupled to the second bit line bar portion.

8. The memory circuit of claim 6, wherein the equalization circuit comprises:
    a first transistor having a first terminal coupled to a signal line, a second terminal coupled to the second bit line portion, and a third terminal coupled to the second bit line bar portion.

9. The memory circuit of claim 1, wherein the first bit line bar portion is configured to be floating after the sense amplifier is electrically isolated from the first bit line bar.

10. The memory circuit of claim 1, wherein the second switch is further configured to couple the sense amplifier with the first bit line portion, after a read operation of the memory cell.

11. A memory circuit comprising:
    a memory cell coupled with a first bit line having a first bit line portion and a second bit line portion;
    a first bit line bar having a first bit line bar portion and a second bit line bar portion;

a sense amplifier comprising a read/write circuit being configured to couple the second bit line portion to a global bit line;

a first switch coupled between the first bit line bar portion and the second bit line bar portion, the first switch being configured to (1) electrically isolate the first bit line bar portion and the sense amplifier based on a first received signal during a first time interval, where a first voltage difference between the second bit line portion and the second bit line bar portion is substantially equal to or larger than a predetermined value, and to (2) electrically isolate the first bit line bar portion from the sense amplifier during a second time interval, where the read/write circuit is configured to couple the second bit line portion and the global bit line; and a second switch coupled between the first bit line portion and the second bit line portion, the second switch being configured to electrically couple the first bit line portion and the second bit line portion during a period of time when the second bit line portion is coupled to the global bit line, wherein the first switch is configured to electrically isolate the sense amplifier from the first bit line bar portion during a period of time when the first bit line portion is electrically coupled to the sense amplifier.

12. The memory circuit of claim 11, wherein the first bit line bar is free from continuously extending between the first memory array and the sense amplifier.

13. The memory circuit of claim 11, wherein the first received signal is different from the second received signal.

14. The memory circuit of claim 11, wherein the second switch is further configured to couple the sense amplifier with the first bit line portion, after a read operation of the memory cell.

15. The memory circuit of claim 11, wherein during the first time interval the second switch is further configured to electrically isolate the sense amplifier from the first bit line portion based on the second received signal; and the sense amplifier is further configured to sense the first voltage difference between the second bit line portion and the second bit line bar portion based, at least in part, on a determination that the first voltage difference is substantially equal to or larger than the predetermined value.

16. The memory circuit of claim 11, further comprising a control circuit configured to control the first switch to open when the first voltage difference is equal to or larger than the predetermined value.

17. A method for accessing a datum stored within a memory cell, the method comprising:

operating a sense amplifier to sense a first voltage difference between a bit line and a bit line bar, the bit line being coupled to the memory cell, the bit line having a first bit line portion and a second bit line portion, and the bit line bar having a first bit line bar portion and a second bit line bar portion;

electrically isolating the first bit line bar portion from the sense amplifier after the first voltage difference is equal to or greater than a predetermined value;

electrically isolating the first bit line portion from the sense amplifier after the first voltage difference is equal to or greater than a predetermined value;

electrically isolating the first bit line bar portion from the sense amplifier after receiving a select signal;

coupling the first bit line portion and the sense amplifier after receiving the select signal and during a period of time when the first bit line bar portion is electrically isolated from the sense amplifier; and coupling the first bit line portion and the second bit line portion during a period of time when the second bit line portion is coupled to a global bit line.

18. The method of claim 17, wherein coupling the first bit line portion and the sense amplifier comprises operating a read/write circuit of the sense amplifier to couple the second bit line portion and the global bit line.

19. The method of claim 18, wherein a voltage state of the first bit line portion and the second bit line portion are pulled to a first logical value, and a voltage state of the second bit line bar portion is pulled to a second logical value during a time interval where the read/write circuit is operated to couple the second bit line portion and the global bit line.

20. The method of claim 17, further comprising:

electrically coupling the first bit line bar portion to the sense amplifier if the first voltage difference is less than the predetermined value;

electrically coupling the first bit line portion to the sense amplifier if the first voltage difference is less than the predetermined value;

floating the first bit line bar portion after electrically isolating the bit line bar from the sense amplifier; and coupling the first bit line portion and the sense amplifier for restoring the datum to the memory cell.

* * * * *